United States Patent
Xi et al.

(10) Patent No.: US 7,381,625 B2
(45) Date of Patent: Jun. 3, 2008

(54) DETERMINISTIC PROCESS FOR CONSTRUCTING NANODEVICES

(75) Inventors: Ning Xi, Okemos, MI (US); Guangyong Li, East Lansing, MI (US); Jiangbo Zhang, East Lansing, MI (US); Hoyin Chan, Okemos, MI (US)

(73) Assignee: Board of Trustees operating Michigan State University, East Lansing, MI (US)

( * ) Notice: Subject to any disclaimer, the term of this patent is extended or adjusted under 35 U.S.C. 154(b) by 0 days.

(21) Appl. No.: 11/546,499

(22) Filed: Oct. 11, 2006

(65) Prior Publication Data

US 2008/0108172 A1   May 8, 2008

Related U.S. Application Data

(60) Provisional application No. 60/725,739, filed on Oct. 12, 2005.

(51) Int. Cl.
*H01L 21/76* (2006.01)
(52) U.S. Cl. .............. 438/432; 438/296; 438/400; 257/E39.016; 257/E51.019; 977/700
(58) Field of Classification Search ............ 438/432
See application file for complete search history.

(56) References Cited

U.S. PATENT DOCUMENTS 6,946,410 B2 * 9/2005 French et al. ............... 438/800
7,063,753 B1 * 6/2006 Chen et al. .................. 148/108
7,071,023 B2 * 7/2006 Bertin et al. .................. 438/99
2005/0130296 A1 * 6/2005 Pisharody et al. ....... 435/287.2
2007/0059645 A1 * 3/2007 Tang et al. .................. 430/311

OTHER PUBLICATIONS

B. Babic, M. Iqbal and C, Schonenberger, "Ambipolar field-effect transistor on as-grown single-wall carbon nanotubes" *Nanotechnology*, v. 14, pp. 327-331, 2003.
A. Javey, J. Guo, Q. Wang, M. Lundstrom and H. Dai, "Ballistic carbon nanotube field-effect transistors" *Nature*, 424, pp. 654-657, 2003.
M. Freitag, Y. Martin, J. A. Misewich, R. Martel and Ph. Avouris, "Photoconductivity of single carbon nanotubes" *Nano Letters*, v. 3, No. 8, pp. 1067-1071, 2003.
T. Rueckes, K. Kim, E. Joselevich, G. Y. Tseng, C. L. Cheung and C. M. Lieber, "Carbon nanotube-based nonvolatile random access memory for molecular computing" *Science*, v. 289, pp. 94-97, Jul. 2000.

(Continued)

*Primary Examiner*—Walter Lindsay, Jr.
*Assistant Examiner*—Abdulfattah Mustapha
(74) *Attorney, Agent, or Firm*—Harness, Dickey & Pierce, P.L.C.

(57) ABSTRACT

A method is provided for constructing a nanodevice. The method includes: fabricating an electrode on a substrate; forming a nanogap across the electrode; dispersing a plurality of nanoobjects onto the substrate using electrophoresis; and pushing one of the nanoobjects onto the electrode using a tip of an atomic force microscope, such that the nanoobject lies across the nanogap formed in the electrode. In addition, remaining nanoobjects may also be pushed away from the electrode using the atomic force microscope, thereby completing construction of a nanodevice.

28 Claims, 9 Drawing Sheets

OTHER PUBLICATIONS

J. A. Misewish, R. Martel, Ph. Avouris, J. C. Tsang, S. Heinze and J. Tersoff, "Electricity induced optical emission from a carbon nanotube FET" *Science*, v. 300, pp. 783-786, 2003.

E. D. Minot, Y. Yaish, V. Sazonova, J. Y. Park, M. Brink and L. Mceuen, "Tuning carbon nanotube band gaps with strain" *Phys, Rev Lett.*, v. 90, No. 15, 156401, 2003.

R. Martel, V. Derycke, C. Lavoie, J. Appenzeller, K. K. Chan, J. Tersoff and Ph. Avouris, "Ambipolar electrical transport in semiconducting single-wall carbon nanotubes" *Phys. Rev. Lett.*, v. 87, No. 25, 256805, 2001.

A. Maiti and A. Ricca, "Metal-nanotube interactions—binding energies and wetting properties" *Chem. Phys. Lett.*, v. 395, pp. 7-11, 2004.

M. Freitag, M. Radosavlijevic, W. Clauss and A. T. Johnson, "Local electronic properties of single-wall nanotube circuits measured by conducting—tip AFM" *Phys. Rev. B*, v. 62, No. 4, pp. 2307-2311, 2000.

Y. Zhang, A. Chang, J. Cao, Q, Wang, W. Kim, Y. Li, N. Morris, E. Yenilmez, J. Kong and H. Dai, "Electric-field-directed growth of aligned single-walled carbon nanotubes" *Appl. Phys. Lett.*, v. 79, No. 19, pp. 3155-3157, 2001.

R. Krupe, F. Hennrich, H B. Weber, M. M. Kappeas, H. V. Lohneysen, "Simultaneous deposition of metallic bundles of single-walled carbon nanotubes using AC-dielectrophoresis" *Nano Lett.*, v. 3, No. 8, pp. 1019-1923, 2003.

K. M. Fung, T. S. Wong, H. M. Chan and W. J. Li, "Dislectrophoretic batch fabrication of bundled carbon nanontube thermal sensors", *IEEE Trans, on nanotechnology*, v. 3, pp. 395-403, 2004.

K. Tsukagoshi, N. Yoneya, S. Uryu, Y. Aoyagi, A. Kanda, Y. Ootuka, B. W. Alphenaar, "Carbon nanotube devices for nanoelectronics" *Physica B*, v. 323, pp. 107-114, 2002.

J. Lefebvre, M. Radosavljevic and A. T. Johnson, "Fabrication of nanometer size gaps in a metallic wire" *Appl. Phys. Lett.*, v. 76, No. 25, pp. 3828-3830, 2000.

M. Deshmukh, D. C. Ralph, M. Thomas and J. Silcox, "Nanofabrication using a stencil mask" *Appl. Phys. Lett.*, v. 75, pp. 1631-1633, 1999.

S. G. Rao, L. Huang, W. Setyawan, S. Hong, "Large-scale assembly of carbon nanotubes" *Nature*, v. 425, pp. 36-37, 2003.

M. Hazani, F. Hennrich, M. Kappes, R. Naaman, D. Peled, V. Sidorov, D. Shvarts, "DNA-mediated self-assembly of carbon nanotube-based electronic devices" *Chem. Phys. Lett.*, v. 391, pp. 389-392, 2004.

M. Sitti and H. Hashimoto, "Tele-nanorobotics using atomic force microscope" *Proc. Of IEEE Int. Cong. Intelligent Robots and Systems*, Victoria, Canada, pp. 1739-1749, 1998.

R. Resch, C. Baur, A. Bugacov, B. E. Koel, A. Madhukar, A. G. Requicha and P. Will, "Building and manipulating three-dimensional and linked two-dimensional structures of nanoparticles using scanning force microscopy" *Langmuir*, v. 14, No. 23, pp. 6613-6616, 1998.

M. Guthold, M. R. Falvo, W. G. Matthew, S. S. Washburn, Paulson and D. A. Erie, "Controlled manipulation of molecular samples with the nanomanipulator" *IEEE/ASME Trans. On Mechatrontics*, v. 5, No. 2, pp. 189-198, 2000.

G. Y. Li, N. Xi, H. P. Chen, C. Pomeroy and M. Prokes, "Videolized" atomic force microscopy for interactive nanomanipulation and nanoassembly *IEEE Trans. on Nanotechology*, accepted, 2005.

\* cited by examiner

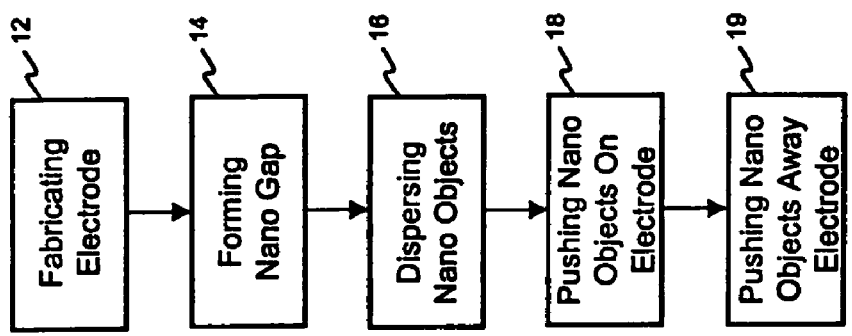

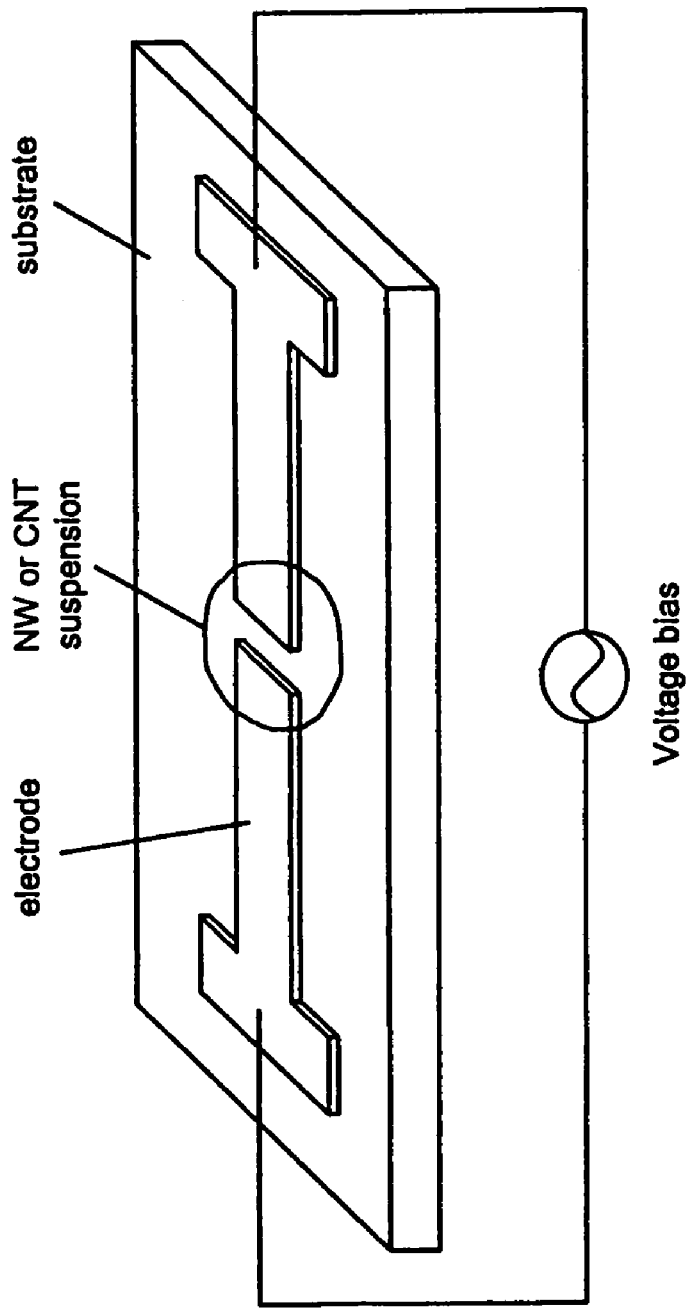

United States Patent US 7,381,625 B2

DETERMINISTIC PROCESS FOR CONSTRUCTING NANODEVICES

CROSS-REFERENCE TO RELATED APPLICATIONS

This application claims the benefit of U.S. Provisional Application No. 60/725,739, filed on Oct. 12, 2005. The disclosure of the above application is incorporated herein by reference.

FIELD OF THE INVENTION

The present invention relates generally to constructing nanodevices and, more particularly, to a deterministic process for fabricating and assembling single carbon nanotube or nanowire based devices.

BACKGROUND OF THE INVENTION

Recently, numerous researchers have been mainly focused on the development of nanoelectronics especially for its applications on nanosystems or devices. Engineers attempted to minimize not only conventional circuit elements like transistors but also the entire integrated circuit including memory storage units. One of the key challenges for achieving nanodevices is to enable low resistance electrical contacts and reproducible connections between electrodes whose width of the gap is often in nanometer scales. Such nanodevices often use carbon nanotubes (CNTs), nanowires (NWs), or quantum dots (QDs) as the interconnecting material because of their unique electrical and thermal properties. The ballistic transport in CNTs and NWs makes carriers suffering no scattering event even at room temperature, compared to other semi-conducting materials. Due to the direct band gap property, CNTs also play an important role in optoelectronics, and act as an essential element for both optical detection and optical emission. Thus, many papers are published on examining different properties of individual CNT under different conditions so as to explore more applications.

Current methods in making CNT or NW connections includes direct CNT and NW growth across electrodes, deposition of as-grown CNTs or NWs on electrodes by dielectrophoresis, fabrication of electrodes on top of as-deposited CNTs or NWs either by electron-beam (E-beam) lithography or shadow masks, and self-assembly by functionalizing CNTs or NWs and electrodes with different chemicals or even DNA molecules. To a certain extent, these methods have their shortcomings in terms of repeatability and ability in eliminating uncertainties. Thus, it is highly desired to have a reliable and repeatable way to form CNT or NW electrical connection across electrodes.

SUMMARY OF THE INVENTION

A method is provided for constructing a nanodevice. The method generally includes: fabricating an electrode on a substrate; forming a nanogap across the electrode; dispersing a plurality of nanoobjects onto the substrate using electrophoresis; and pushing one of the nanoobjects onto the electrode using a tip of an atomic force microscope, such that the nanoobject lies across the nanogap formed in the electrode. In addition, remaining nanoobjects may also be pushed away from the electrode using the atomic force microscope, thereby completing construction of a nanodevice.

In another aspect of the present invention, the bandgap of the nanodevice can be tuned by an electrical breakdown of the multiwalled carbon nanotubes.

One advantage of this deterministic approach is that it can fabricate electrode gaps whose widths range from a few nanometers to hundreds of nanometers which is usually difficult to be achieved by standard semiconductor fabrication techniques. Another advantage of this deterministic approach is that it can fabricate the nanodevice in a reproducible way. Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

FIG. 1 is a flowchart depicting a method for constructing a nanodevice according to the present invention;

FIG. 3 is a diagram illustrating the electrophoresis deposition process in accordance with the present invention;

DETAILED DESCRIPTION OF THE PREFERRED EMBODIMENTS

FIG. 1 depicts a method for constructing a nanodevice according to the principles of the present invention. Briefly, the method can be divided into three parts: fabrication of the connecting electrodes by a photolithography process, assembly of the nanodevice by a nanomanipulation operation, and optimization of the nanodevice. Assembly of the nanodevice is further defined by scratching a gap across the electrode at step 14, dispersing a plurality of nanoobjects onto the electrode surface using electrophoresis at step 16, and positioning one of the nanoobjects onto the electrode using an atomic force microscope at step 18, thereby constructing a nanodevice. Optimization of the nanodevice may further include improving the contact region of the nanoobjects, removing the absorbed oxygen from the nanodevice, bandgap tuning of the nanodevice through electrical breakdown and packaging the nanodevice for protection. Each of these steps is further described below.

Figure 2C:
FIGS. 2A-2D are diagrams illustrating an exemplary fabrication process for electrodes.
Figure 2D:
Figure 2A:
Figure 2B:

An exemplary fabrication process for electrodes is shown in FIGS. 2A-2D. The fabrication process starts with a transparent quartz substrate (e.g., ~500 μm). Referring to FIG. 2A, a 1.5 μm thick photoresist (e.g., AZ5214E) is span on the substrate and patterned by an AB-M mask aligner. The exposed areas were developed by AZ300 developer as shown in FIG. 2B. In FIG. 2C, a titanium (e.g., 20 Å) and a gold (e.g., 20 nm) layer are deposited by an Edward Auto306 thermal evaporator. The titanium layer is used to promote the adhesion between the gold and quartz substrate. This layer is patterned by a lift off process. The photoresist underneath this layer is then etched by acetone as shown in FIG. 2D, thereby forming electrodes. It is readily understood that other lithographic processes may be used to fabricate electrodes.

The assembly process begins by creating a nanogap in the electrode. In an exemplary embodiment, the nanogap may be formed by scratching a tip of an atomic force microscope at desired positions. In this way, gaps of different widths may be formed. To ensure that the connecting path was broken, the resistance across the two electrodes is measured before and after the scratching operation. It is envisioned that other techniques may be employed to form a nanogap in the electrode structure.

To reduce surface adhesive forces, the substrate surface may undergo hydrophobization prior to the electrophoresis deposition. An exemplary hydrophobization process for quartz is further described. First, the substrate surface is exposed to UV light for 15 minutes to remove any organic material thereon. The substrate surface is then soaked in concentrated $NH_4OH$ for about one hour and washed five times by ultrasonication in distilled water. The substrate surface is dried for another hour at 140° C. and then placed directly in methanol to the keep the surface free from water vapors and other unwanted adsorbents. The substrate surface is then silanized by immersion in an n-octadecyltrimethoxysilane solution in hetane for 24 hours. After immersion, the silanized surfaces are washed three times with hetane to remove unreacted silane materials. The treated surfaces are heated for one additional hour at 70° C. Lastly, the treated surfaces are rinsed with acetone to remove any unreacted silane and stored in methanol prior to further processing. It is readily understood that different procedures should be used for hydrophobization of different materials.

The assembly process then combines an electrophoresis deposit method with nanomanipulation operations to precisely position a nanoobject between the two electrodes. For electrophoresis deposition, acetone or some other suitable solvent may be used to disperse nanowire or nanotube powder. For example, about 0.1 µg of nanotube powder is dispersed in 10 mL of acetone. The solution may further undergo ultrasonic treatment that is intended to unrope a bundle of nanowires or nanotubes into individual nanoobjects. While the following description is provided with reference to nanowires and nanotubes, it is readily understood that the present invention is applicable to other types of nanoobjects including but not limited to nanorods, nanobeads, etc.

A droplet of the solution is then placed onto the electrode surface using a micropipette system. In an exemplary embodiment, the micropipette system uses a micropump to control the volume of the droplet. The micropipette system also has motors at the end of the pipette that can position the micropipette above the electrodes. Since the volume of the droplet and the position of the micropipette are driven by the micropump and motor, respectively, mass production of this approach may be implemented.

Once the droplet is placed onto the substrate, a bias voltage is applied across the electrodes as diagrammatically shown in FIG. 3. This bias voltage attracts or traps the nanoobjects between the electrodes. The amplitude and frequency of the bias voltage is dependent upon the characteristics of the nanoobjects. For example, the amplitude voltage is set at 1.4 volts for single-wall carbon nanotubes and at 1.8 volts for multi-wall carbon nanotubes. The frequency for this dielectrophoresis process is set to 10 kHz. These parameters may vary for different types of nanoobjects.

Figure 4B:
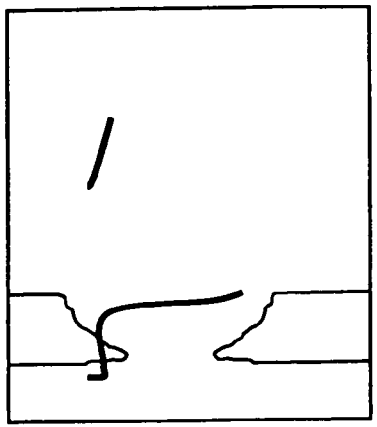
FIGS. 4A-4D are images illustrating the assembly of a nanodevice according to the present invention.
Figure 4D:
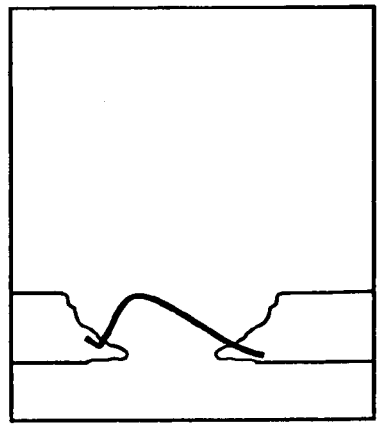
Figure 4A:
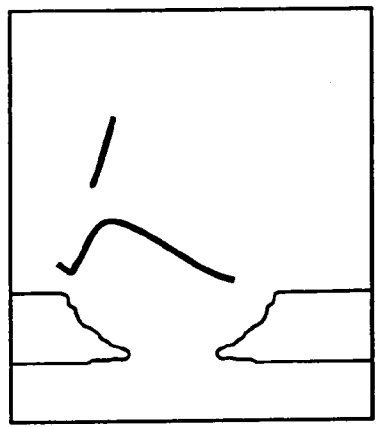
Figure 4C:
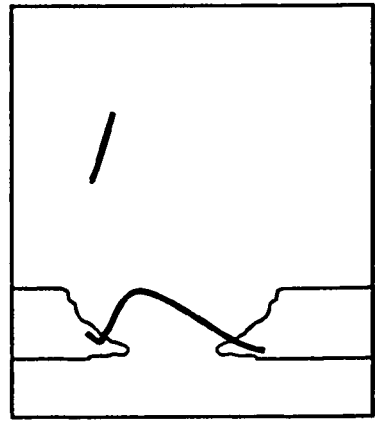

Next, at least one of the nanoobjects is pushed into position by performing a nanomanipulation operation. This pushing process is illustrated by the sequence of images provided in FIGS. 4A-4D. FIG. 4A is an image after the electrophoresis deposition process. As shown, two nanotubes were attracted near to the electrodes. In FIGS. 4B and 4C, the upper and lower part of the closer nanotube, respectively, were pushed towards the electrode by way of a nanomanipulation operation. The unwanted nanotube is then pushed away from the electrodes as shown in FIG. 4D.

Figure 5:
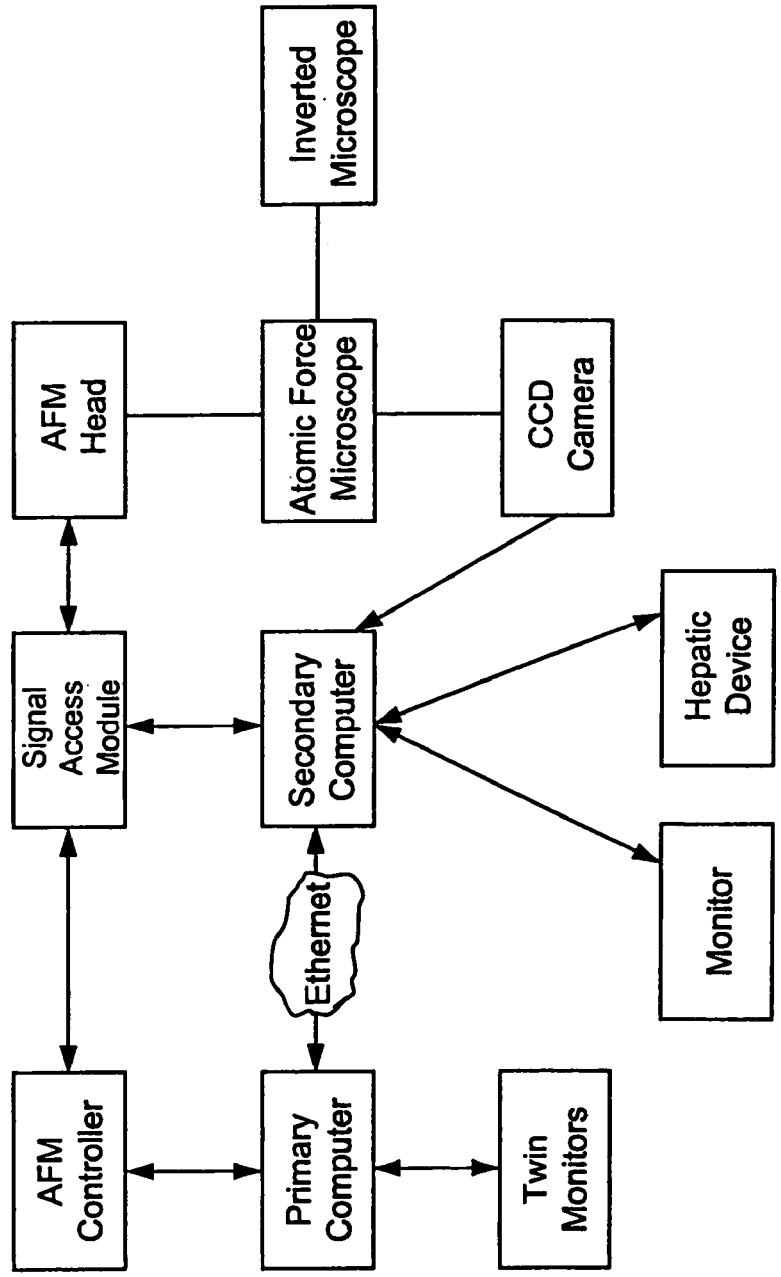
FIG. 5 is a block diagram depicting an exemplary atomic force microscope system for use in the present invention.

In an exemplary embodiment, the nanomanipulations may be performed using an atomic force microscope system as shown in FIG. 5. Briefly, this system includes an atomic force microscope having a control system and an enhanced human interface for the same. An exemplary atomic force microscope is the Bioscope microscope manufactured by Veeco Instruments Inc. The Bioscope system is then equipped with a closed-loop scanning head which is also available from Veeco Instruments Inc. Peripheral devices may include an optical microscope and a charge-coupled device (CCD) camera which help an operator to locate the tip of the atomic force microscope and adjust its laser gun.

In a preferred implementation, the atomic force microscope system is equipped with an augmented reality enhanced interface which will enable the operator to see, feel and be able to manipulate objects in a nano environment. The augmented reality interface is implemented in a computer equipped with a haptic device (e.g., a Phantom™ haptic device available from the Sensable Co.). During a nanomanipulation operation, not only can the operator feel the 3-D interaction forces in real-time through the haptic system but can also observe changes of the nano environment in real-time through the videolized AFM image which is a continually dynamic AFM image of the operating environment. Further details regarding an exemplary AFM system having this interface are found in U.S. patent application Ser. No. 10/428,578 filed on May 2, 2003 and which is incorporated herein by reference. However, it is understood that atomic force microscope systems without the augmented reality enhanced interface feature are also suitable for implementing the present invention. Moreover, it is understood that other types of scanned-proximity probe microscopes (e.g., scanning tunneling microscopes) may be used to perform the nanomanipulation operations.

Figure 6:
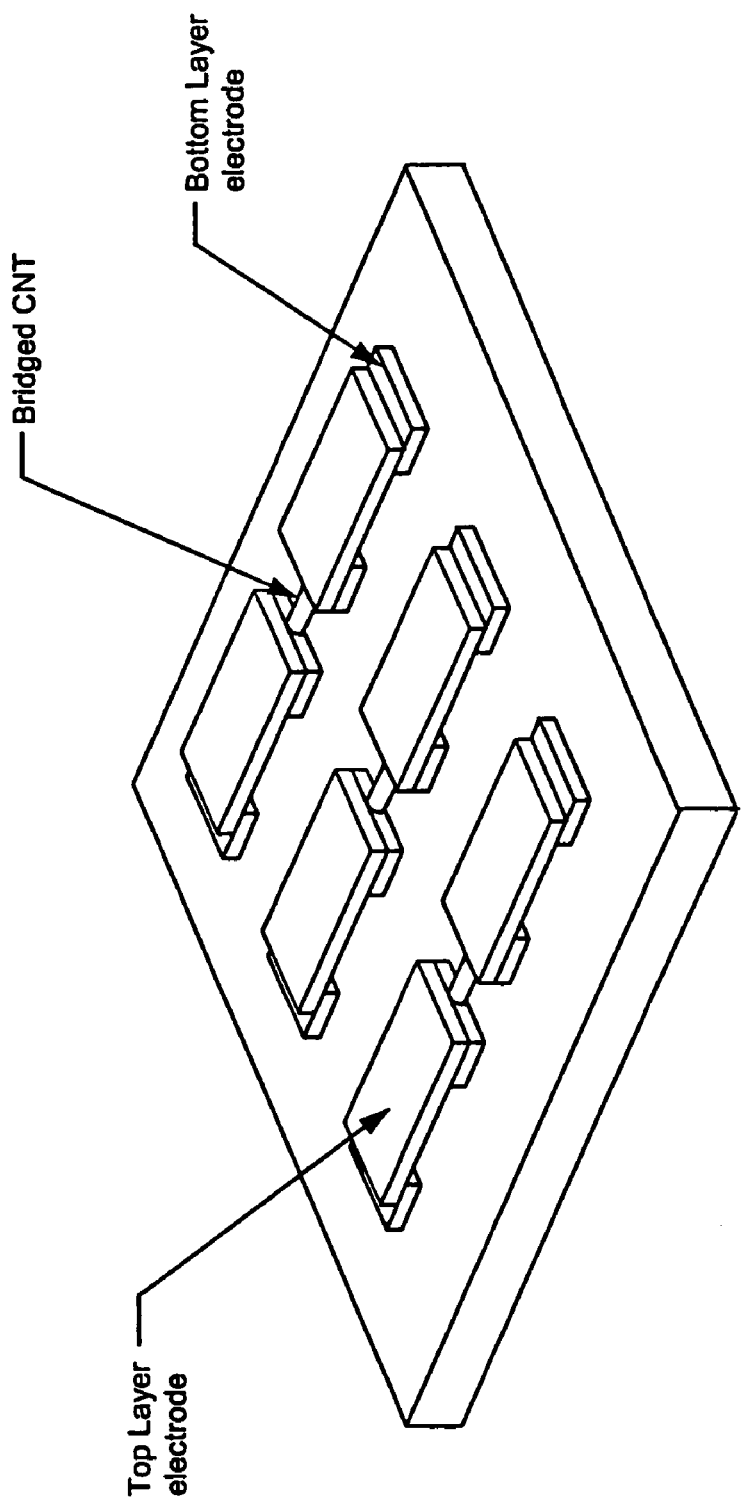
FIG. 6 is a diagram depicting the contact region being covered by a top layer of electrode to reduce the contact resistance.

After positioning the nanotube or nanowire, a series of step may be taken to optimize the nanodevice. For instance, the contact resistance between the nanoobjects and electrodes is minimized by covering the contact region with another layer of electrode by e-beam lithography as shown in FIG. 6. The contact region is covered by a top layer of electrode to reduce the contact resistance. In addition, the nanodevice is annealed at 160° C. in a vacuum oven to remove the oxygen attached to the nanoobjects. During annealing, an ultraviolet light source is provided to assist oxygen removing.

Figure 7:
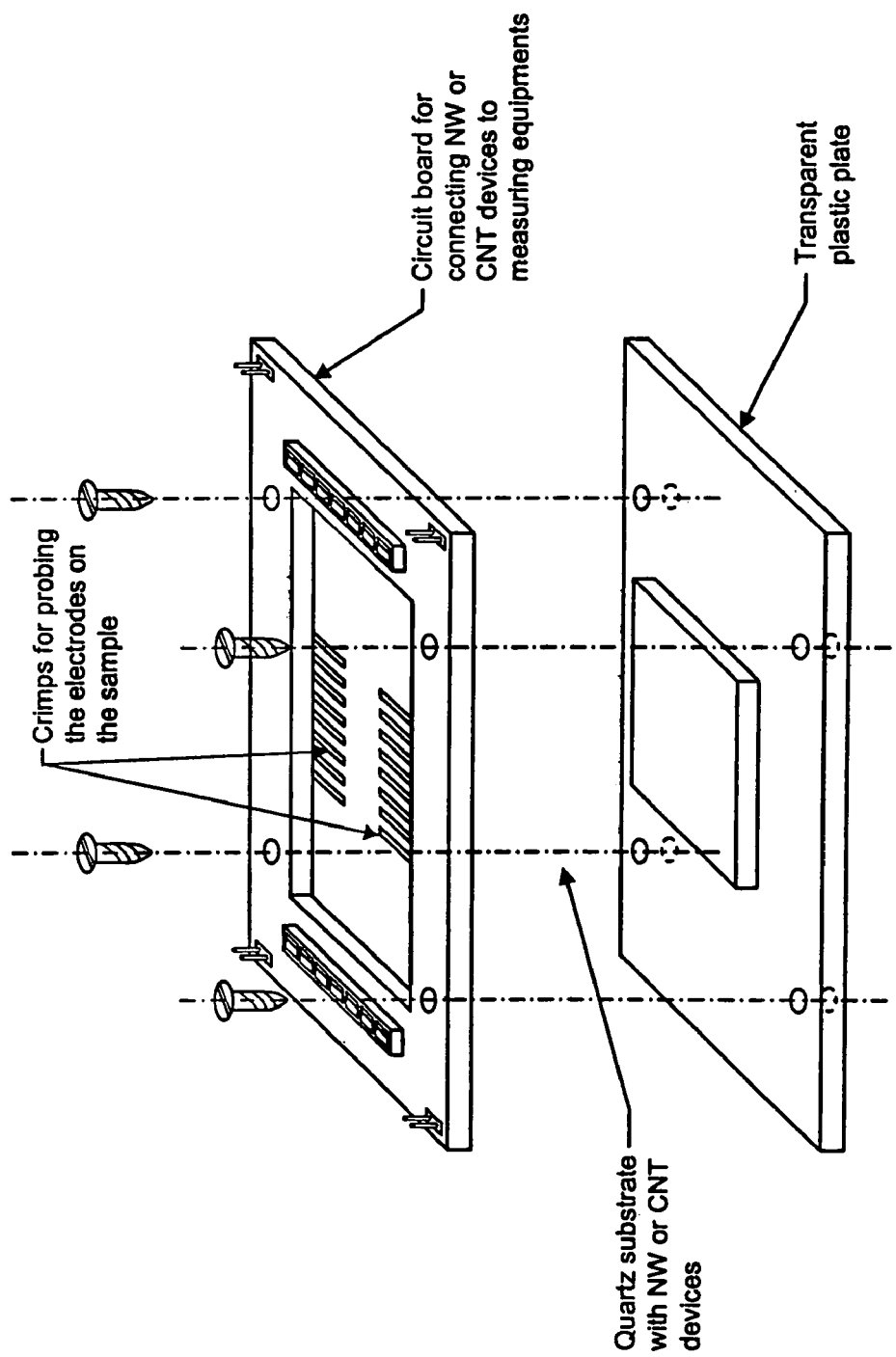
FIG. 7 is a diagram of an exemplary chip fixture for mounting a nanodevice of the present invention.

Referring to FIG. 7, several current measures may be taken to confirm a reliable electrical connection. A chip fixture has been designed to facilitate these measures. The chip fixture is generally comprised of a top plate and a bottom plastic plate. The substrate having the nanodevice is sandwiched between the top plate and the bottom plate. Four screws or other connection means may be used to couple the top plate to the bottom plate, thereby securing the nanodevice substrate therebetween. By probing the electrode with crimps protruding from inwardly from the top plate, the fixture is used to connect the nanodevice to measuring equipment. Thus, this fixture enables measurements of the nanodevice. In addition, this fixture protects and facilitates easy handling of the nanodevice.

Furthermore, the bandgap of the nanodevice may be tuned in accordance with another aspect of the present invention. In the case of carbon nanotubes, the bandgap is inversely proportional to its diameter. For a multi-walled carbon nanotube, it is found that its walls can be burnt stepwise by inputting power beyond a threshold point. Thus, the bandgap can be altered by reducing the tube diameter through a breakdown process as will be further described below.

Figure 8:
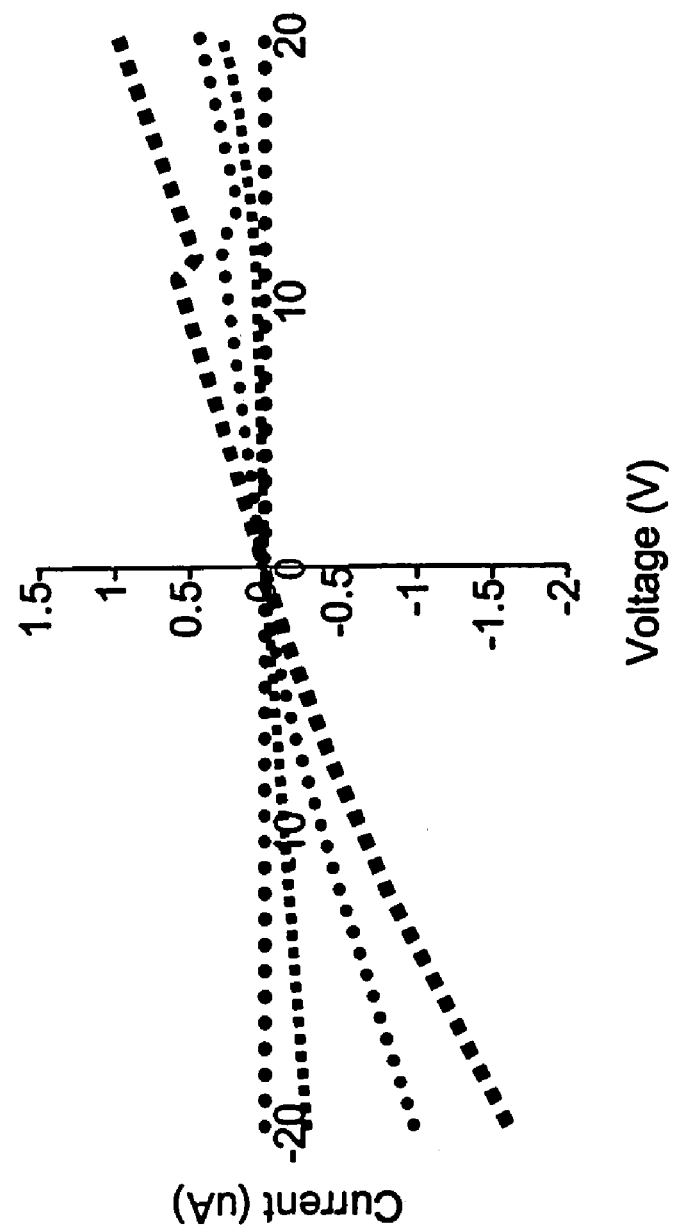
FIG. 8 is a graph of the current and voltage relationship of a single multi-walled carbon nanotube.

Current-voltage (I-V) relationship of a single multi-walled carbon nanotube connection was measured as shown in FIG. 8. A 20V peak-to-peak voltage was applied across the electrodes. Four times measurement was carried out and found that initially the resistance of the nanotube obeyed ohm's law and thus exhibited metallic behavior. However, at fourth measurement, the nanotube behavior became a semi-conducting one rather than a metallic one. This phenomenon can be described by the electrical breakdown of the nanotube. By investigating the I-V curves of the first three measurements, it is found that the currents suddenly dropped at a certain threshold voltages and increased again. This is because the walls of the nanotube were burnt and those walls caused the metallic behavior of the nanotube. This is similar to the characteristics of a semiconducting diode. Thus, it is shown that the metallic nanotube became a semiconductor. The breakdown occurs at the middle of the nanotube.

Figure 9:
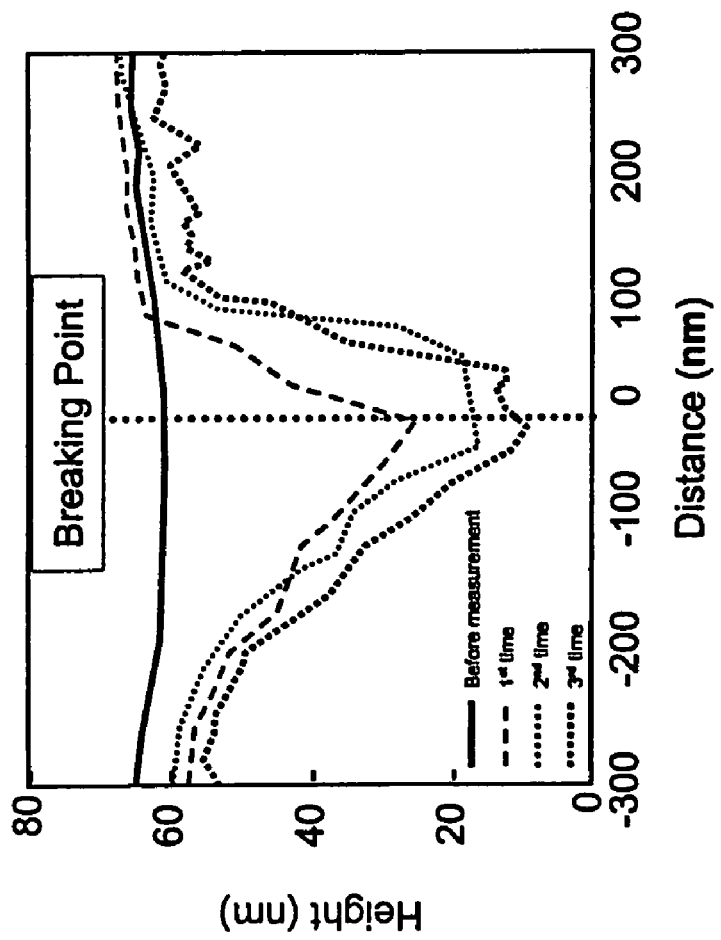
FIG. 9 is a graph depicting the heights profiles of nanotube after taking different measurements.

Height profiles at the breaking point are shown in FIG. 9. From these height profiles, it is shown that several walls were actually burnt at each measurement because the thickness of each wall is around several nanometers. The nanotube resistance increases when the tube diameter decreases as shown in FIG. 5. Thus, higher voltage should be used to burn inner walls as compared to the outer walls. The controlled breakdown process depends highly on the quality and types of nanotubes.

Nevertheless, the bandgap of carbon nanotubes can be tuned by electrical breakdown process. It is because the bandgap depends highly on the tube diameter. For a multi-walled carbon nanotube, the bandgap can be estimated by $$E_g \approx \frac{3}{\sqrt{2}} M_i \overline{\omega}^2 \frac{a^3}{D} \quad (1)$$

where $M_i=2\times10^{23}$ g is the mass of carbon atom, $\overline{\omega} \sim 1600$ cm$^{-1}$ is the characteristic phonon frequency, a=1.41 Å is the C—C nearest neighbor distance, and D is the diameter of the MWNT.

After each electrical breakdown, the bandgap of the MWNT will be calculated based on the new measurements. Another electrical breakdown will be performed if the bandgap is not in the required range. The process repeats until the bandgap of the MWNT falls in the required range. If the MWNT is a metallic one, it will be burn out finally. A new CNT deposition process will be performed and the badgap tuning process will be performed once again. A tunable IR source may be used to measure the bandgap of the MWNT. By monitoring changes of the response current to IR source, the bandgap can be calculated directly from the wavelength of the responsive IR.

After bandgap tuning and testing, the nanodevice is covered by a layer of polymer to protect the nanoobjects from oxidation and static electrical charge.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for constructing a nanodevice, comprising:
fabricating an electrode structure on a substrate surface;
forming a nanogap across the electrode structure, thereby forming a pair of electrodes;
dispersing a plurality of nanoobjects onto the substrate surface using electrophoresis; and
positioning one of the nanoobjects in relation to the pair of electrodes using a tip of an atomic force microscope, wherein the one nanoobject connects one of the electrodes to the other electrode.

2. The method of claim 1 wherein the step of fabricating an electrode structure further comprises using a photolithographic process.

3. The method of claim 1 wherein the step of fabricating an electrode structure further comprises using quartz as a substrate.

4. The method of claim 1 wherein the step of forming a nanogap further comprises scratching the tip of the atomic force microscope across the electrode structure.

5. The method of claim 4 further comprises measuring resistance across the electrode structure before and after scratching to ensure an electrical path was broken.

6. The method of claim 1 further comprises exposing the substrate surface to a hydrophobization process prior to dispersing a plurality of nanoobjects onto the surface.

7. The method of claim 1 wherein the step of dispersing a plurality of nanotubes further comprises dissolving a powder of nanoobjects in solvent, placing a droplet of the solvent onto the pair of electrodes and applying a bias voltage between the pair of electrodes.

8. The method of claim 1 further comprises pushing one or more of the plurality of nanoobjects away from the electrodes.

9. The method of claim 1 further comprises forming another electrode on top of the connection between the nanoobject and the pair of electrodes.

10. The method of claim 1 further comprises removing oxygen from the nanobject which connects the pair of electrodes by annealing the nanodevice in a vacuum oven and exposing the nanodevice to ultraviolet light.

11. The method of claim 1 further comprises tuning a bandgap of the nanoobject which connects the pair of electrodes to a desired range by electrical breakdown.

12. The method of claim 11 further comprises measuring the bandgap of the nanoobject from a wavelength of a responsive infrared light source.

13. The method of claim 11 further comprises burning an outer layer of the nanoobject and repeating the burning process until the desired range is achieved.

14. The method of claim 1 applying a layer of polymer to the nanodevice to protect it.

15. A method for constructing a nanodevice, comprising:
fabricating an electrode on a substrate;
forming a nanogap across the electrode;
dispersing a plurality of nanoobjects onto the substrate using electrophoresis; and pushing one of the nanoobjects onto the electrode using a tip of an atomic force microscope, thereby constructing a nanodevice.

16. The method of claim 15 further comprises pushing one or more of the plurality of nanoobjects away from the electrode using the tip of the atomic force microscope.

17. The method of claim 15 wherein dispersing the plurality of nanoobjects further comprises selecting nanoobjects from the group of nanowires, nanotubes, nanorods, nanobeads and quantum dots.

18. The method of claim 15 wherein the step of fabricating an electrode structure further comprises using a photolithographic process.

19. The method of claim 15 wherein the step of forming a nanogap further comprises scratching the tip of the atomic force microscope across the electrode structure.

20. The method of claim 19 further comprises measuring resistance across the electrode structure before and after scratching to ensure an electrical path was broken.

21. The method of claim 15 further comprises treating the substrate surface to form a single molecule monolayer on the substrate surface prior to dispersing a plurality of nanoobjects, thereby making it hydrophobic.

22. The method of claim 15 wherein the step of dispersing a plurality of nanoobjects further comprises using electrophoresis.

23. The method of claim 15 wherein the step of dispersing a plurality of nanotubes further comprises dissolving a powder of nanoobjects in solvent, placing a droplet of the solvent onto the pair of electrodes and applying a bias voltage between the pair of electrodes.

24. The method of claim 15 further comprises forming another electrode over top the nanoobject pushed on the electrode.

25. The method of claim 15 further comprises removing oxygen from the nanobject which forms the nanodevice by annealing the nanodevice in a vacuum oven and exposing the nanodevice to ultraviolet light.

26. The method of claim 15 further comprises tuning a bandgap of the nanoobject which forms the nanodevice to a desired range by electrical breakdown.

27. The method of claim 15 applying a layer of polymer to the nanodevice to protect it.

28. A method for constructing a nanodevice, comprising:
fabricating an electrode on a substrate;
forming a nanogap across the electrode;
treating the substrate to form a hydrophobic surface thereon;
dispersing a plurality of nanotubes onto the substrate using electrophoresis;
pushing at least one of the plurality of nanotubes onto the electrode using a tip of an atomic force microscope;
forming another electrode over the at least one nanotube on the electrode;
removing oxygen from the at least one nanotube by annealing in a vacuum oven;
tuning a bandgap of the nanotube by electrical breakdown; and
applying a layer of polymer over the substrate, thereby forming a nanodevice.

* * * * *

UNITED STATES PATENT AND TRADEMARK OFFICE
CERTIFICATE OF CORRECTION

PATENT NO. : 7,381,625 B2  
APPLICATION NO. : 11/546499  
DATED : June 3, 2008  
INVENTOR(S) : Ning Xi et al.

Page 1 of 1

It is certified that error appears in the above-identified patent and that said Letters Patent is hereby corrected as shown below:

Column 3, line 26, after "to", delete "the".

Column 4, line 49, "step" should be --steps--.

Column 5, line 26, after "at", delete "a".

Column 5, line 61, after "will", delete "be".

Column 8, line 2, Claim 24, after "top", insert --of--.

Column 8, line 11, Claim 27, after "15", insert --further comprises--.

Signed and Sealed this

Second Day of December, 2008

JON W. DUDAS  
*Director of the United States Patent and Trademark Office*

UNITED STATES PATENT AND TRADEMARK OFFICE
CERTIFICATE OF CORRECTION

PATENT NO. : 7,381,625 B2  
APPLICATION NO. : 11/546499  
DATED : June 3, 2008  
INVENTOR(S) : Ning Xi et al.

Page 1 of 1

It is certified that error appears in the above-identified patent and that said Letters Patent is hereby corrected as shown below:

In the Specification

Column 1, line 3 before "CROSS-REFERENCE TO RELATED APPLICATIONS" insert --GOVERNMENT CLAUSE This invention was made with government support under N00014-04-1-0799 awarded by the Office of Naval Research. The government has certain rights in the invention.--

Signed and Sealed this
Seventeenth Day of June, 2014

Michelle K. Lee
*Deputy Director of the United States Patent and Trademark Office*